(12) United States Patent
Wartenbergh (10) Patent No.: US 6,223,396 B1
(45) Date of Patent: May 1, 2001

(54) PIVOTING SIDE HANDLES

(75) Inventor: Robert P. Wartenbergh, Woodside, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/067,122

(22) Filed: Apr. 27, 1998

(51) Int. Cl.[7] ........................................ B65D 25/28
(52) U.S. Cl. .................. 16/430; 16/900; 294/15; 294/27.1
(58) Field of Search .................. 294/27.1, 15, 28, 294/161, 167; 206/710, 711, 712; 220/755, 762, 764, 765, 766, 772; 16/438, 445, 430, 900

(56) References Cited

U.S. PATENT DOCUMENTS

| | | | |
|---|---|---|---|
| 90,798 | * | 6/1869 | Tomlinson ........................... 220/766 |
| 2,373,917 | * | 4/1945 | Ross ..................................... 220/766 |
| 3,924,775 | * | 12/1975 | Andreaggi et al. ................. 220/755 |
| 4,775,072 | * | 10/1988 | Lundblade et al. ................. 220/766 |
| 4,951,956 | * | 8/1990 | Vittone ................................. 16/438 |
| 5,231,731 | * | 8/1993 | Jones, Jr. .......................... 16/114 R |
| 5,390,972 | * | 2/1995 | Galloway ............................ 294/27.1 |
| 5,451,202 | * | 9/1995 | Miller et al. .......................... 602/36 |
| 5,482,161 | | 1/1996 | Williams et al. ..................... 206/711 |
| 5,775,752 | * | 7/1998 | Niemirowski et al. ............... 294/16 |
| 5,850,921 | * | 12/1998 | Shindou et al. ..................... 206/711 |
| 5,870,800 | * | 2/1999 | Chao ................................. 16/114 R |

* cited by examiner

Primary Examiner—Dean J. Kramer
Assistant Examiner—Paul T. Chin
(74) Attorney, Agent, or Firm—Fliesler Dubb Meyer & Lovejoy LLP (57) ABSTRACT

A pod having a novel manual pivoting handle assembly for transporting the pod to and from processing tools in a semiconductor wafer fab. The handle assembly comprises a bracket, a pivoting handle and a spindle. The bracket is a Z-shaped member and includes two D-shaped cut-outs at the top of the bracket and two circular cut-outs at the bottom of the bracket which are placed over T-shaped protrusions and aligned with mounting sleeves located on a recessed area on a pod cover, respectively. Screws fit through the circular cut-outs on the bottom of the bracket and may be threaded into the mounting sleeves on the pod. The bracket includes a mounting boss which is provided for mounting the pivoting handle and includes a notch on the lower portion. The pivoting handle is contoured and held in a manner similar to holding a pistol. The pivoting handle includes grooves on one side for placement of the fingers which facilitates a better grip for the user when transporting the pod. The back of the pivoting handle includes a mounting boss having a projection which engages the bracket mounting boss having the notch. The projection is slightly smaller than the notch on the mounting boss of the bracket and allows for the rotational motion of the handle when the pod is manually carried to and from processing tools in the bay. The optimal amount of rotation is approximately 55 degrees. A spindle is provided in order to secure the handle to the bracket and serve as an axis for the pivoting handle. The pivoting handle allows the pod to be manually carried without injury to a user's hands, wrist and upper extremities.

3 Claims, 12 Drawing Sheets

PIVOTING SIDE HANDLES

BACKGROUND OF THE INVENTION

1. Field of the Invention

The present invention relates to transporting wafer-carrying pods between various processing tools within a bay of a semiconductor wafer fab, and in particular to an ergonomic pivoting handle assembly capable of rotating while the wafer-carrying pod is manually carried.

2. Description of the Related Art

A standardized mechanical interface (SMIF) system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transportation the gaseous media (such as air or nitrogen) surrounding the wafers is essentially stationary relative to the wafers and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 $\mu$m to above 200 $\mu$m. Particles with these sizes can be very damaging in semiconductor processing because of the small geometries employed in fabricating semiconductor devices. Typical advanced semiconductor processes today employ geometries which are one half micron and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.2 $\mu$m and below. In the future, geometries will become smaller and smaller and hence smaller and smaller contamination particles become of interest.

A SMIF system has three main components: (1) sealed pods, having a minimal volume, used for storing and transporting cassettes which hold the semiconductor wafers; (2) enclosures placed over cassette ports and wafer processing areas of processing equipment so that the environments inside the pods and enclosures (after having clean air sources) become miniature clean spaces; and (3) a transfer mechanism to load/unload wafer cassettes from a sealed pod without contamination of the wafers in the wafer cassette from external environments.

Typically a pod is transferred between various tools and other equipment within a bay of a semiconductor wafer fab. A tool bay may include on the order of approximately 15 to 20 process and metrology tools, one or more stockers for storing large numbers of pods, and a number of local tool buffers for storing pods adjacent to high throughput or metrology tools. Although many semiconductor wafer fab processes provide for an automated transport system, many times it is necessary to manually carry the wafer-carrying pod to or from a processing tool or lift or lower the pod onto a stocker or local tool buffer.

Figure 1:
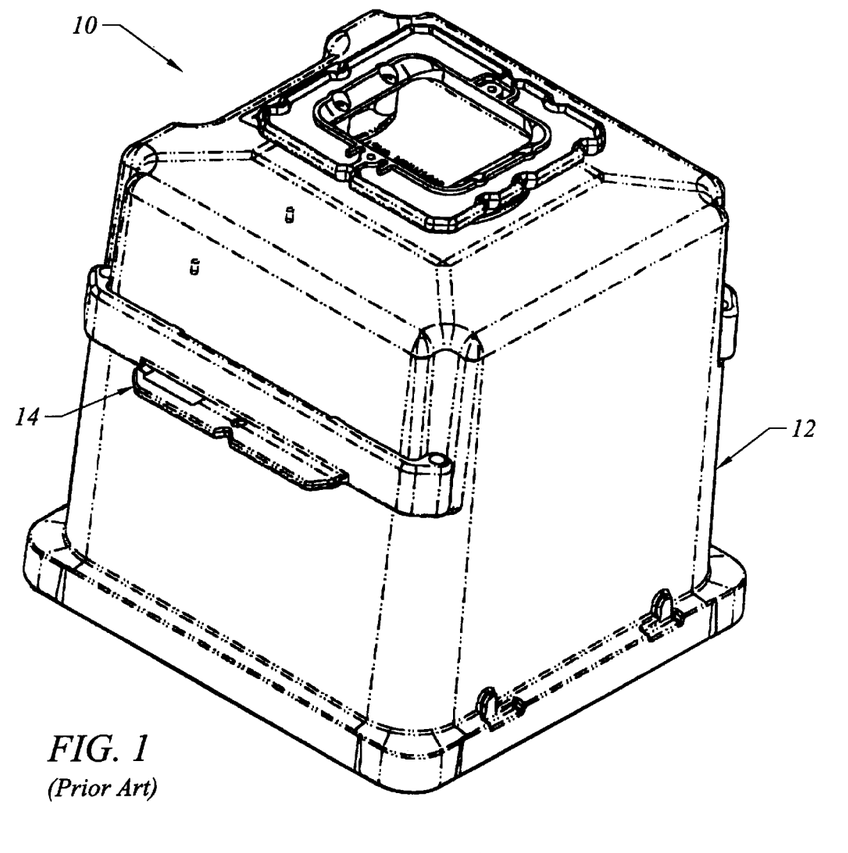
FIG. 1 is an isometric view of a pod including conventional handles.

FIG. 1 illustrates conventional structures on a pod allowing the pod to be carried within a bay of a semiconductor wafer fabrication clean room. Typically, pods may be lifted from a 36-inch high work surface to a 52-inch high work surface. The pod 10 comprises a cover 12 including ergo handles 14 extending from the sides of the pod. The hands of a user are placed underneath the ergo handles 14, and a combination of upward force against the ergo handles and palm lifts the pod. The design of the pod 10 tends to force the user to adapt his or her wrist posture to the geometry of the pod and the pod handle design. When lifting or setting down a pod, the user's wrists tend to rotate in order to keep the pod vertical. This wrist rotation exerts a torque on the user's wrists. Moreover, fixed handles have a tendency to force the wrist into non-neutral postures even when no manual pod rotation is involved in handling the device. Furthermore, this design may lead to mishandling of the pod by the operator because transporting the pod is dependent on the operator's dexterity to support the pod in a vertical position.

The conventional way of transporting a pod was found to put undue pressure and stresses on the small joints of the hands (i.e. on the soft tissue of the palm near the thumb, called the Thenar muscle group) and wrists, as well as the larger supporting joints and muscles of the elbow, shoulder, and neck. Users often experience discomfort and, over time, develop tissue and nerve damage resulting in pain, weakness, burning, tingling and numbing in these areas. In the worst case scenarios, users may form tendinitis and carpal tunnel syndrome in their extremities. Moreover, a user's discomfort and tissue damage is often exacerbated by variations in human anthropometry, especially for smaller individuals, which are often not entirely accommodated in the design of the pod being carried. Anthropometry is the study and technique of human body measurement for use in anthropological classification and comparison. Furthermore, the weight of the pod which is typically 11 to 15 pounds, adds to the discomfort of the user when the pod is being repetitively lowered, lifted and rotated during transport to and from processing tools.

With the demand for ever-increasing output and production of semiconductor wafers, a redesign of the conventional method for carrying a pod in a labor intensive industry is required. In order to accommodate these demands, there is a need for a pod which includes an ergonomic handle design. Ergonomics is an interdisciplinary study that examines the relationship between workers and their work environment, the goal being to maximize worker comfort and efficiency in the workplace. Taking this into consideration, the ergonomic design of semiconductor equipment can result in reduced risk of injury, increased worker productivity, and reduced downtime during maintenance. SEMI S8 which is the "Safety Guidelines for Ergonomics/Humans Factors Engineering of Semiconductor Manufacturing Equipment" establishes criteria for the design of semiconductor manufacturing equipment where risk of injury or illness is minimized, and work productivity and comfort are enhanced. Specifically, SEMI S8-95 states that semiconductor manufacturing equipment should be designed to accommodate the physical dimensions of more than 90 percent of the user population and is directed towards minimizing the risk of upper extremity carpal tunnel disorder risk. Moreover, SEMI S8-95 provides handle design guidelines for device manufacturers and specifies that wrist deviation should not exceed 10 degrees, in order to minimize stresses at the wrist joint.

Figure 2:
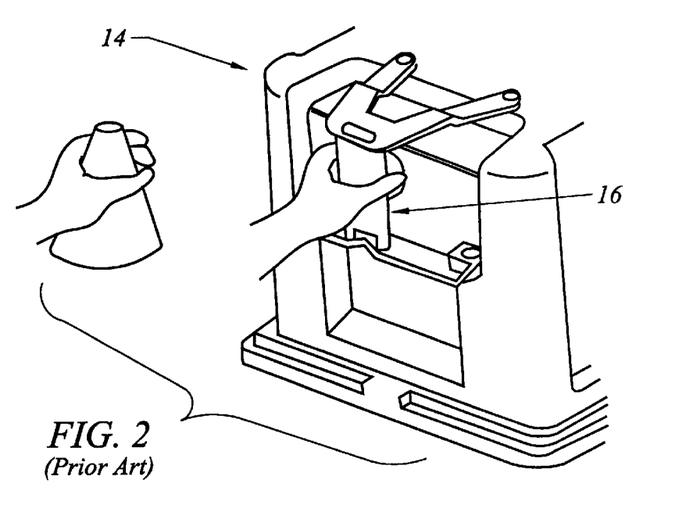
FIG. 2 is an isometric view of a pod including conventional pistol grip handles.

In an effort to improve the conventional handle design, a pod 14 having a pistol grip handle 16, as shown in FIG. 2, was developed in order to eliminate wrist motion fatigue and discomfort. However, this design, although providing a more comfortable grip for the user, did not eliminate the hand and wrist problems caused from handling the pod. The pistol grip remained perfectly vertical and stationary relative to the pod causing the user to adapt his/her wrist posture to the geometry of the pod and pod handles so that the pod also remained substantially vertical. As explained above, a handle design allowing the upper extremities to remain in neutral positions while the pod is transported to and from the processing tools or stocker is desired for elimination of user discomfort and injuries.

SUMMARY OF THE INVENTION

It is therefore an advantage of the present invention to provide an ergonomic handle which reduces wrist, hand and upper extremity discomfort.

It is another advantage of the present invention to provide an extremely simple and effective method for transferring pods to and from processing tools.

It is a further advantage of the present invention to provide a handle which facilitates the lifting of a pod by users of all stature and sizes.

It is another advantage of the present invention to provide a pivoting handle which promotes neutral wrist posture.

It is yet another advantage of the present invention to provide an ergonomic handle which reduces risk of user injury and improves worker productivity.

It is still a further advantage of the present invention to provide a pivoting handle which alleviates undue pressure on the soft tissue of the palm near the thumb, thereby reducing possible tissue and nerve damage resulting in pain and numbing in the area.

It is yet another advantage to provide a pivoting handle which reduces the chances for dropping the pod while the pod is being transported to and from processing tools.

It is a further advantage of the present invention to provide a handle having grooves which provides for better gripping of the handle while transporting the pod.

It is another advantage of the present invention to provide a handle having a flange which rest on the thumb and index finger so that the handle may not slip through a user's hand when grasping during transport.

It is another advantage of the present invention to provide a handle assembly which allows more weight to be lifted.

It is yet still a further advantage of the present invention to provide a handle which eliminates the potential danger that a pod will be mishandled during transport.

It is still another advantage of the present invention to provide a handle which even where wrists rotate, the pod stays level to reduce torque to the wrists.

These and other advantages are provided by the present invention, which in the preferred embodiment relates to a new and improved pivoting handle assembly for manually transporting a pod. The handle assembly includes a bracket, a pivoting handle and a spindle. A bracket is provided for securely supporting the pivoting handle on the pod. The bracket is a Z-shaped member and includes two D-shaped cut-outs at the top of the bracket and two circular cut-outs at the bottom of the bracket. The bracket may be securely attached to the side of the pod by placing the D-shaped cut-outs over T-shaped protrusions located on a recessed area on the top of a pod cover, and also by aligning the circular cut-outs with mounting sleeves located on the bottom of the recessed area on the side of the pod cover. A plurality of screws fit through the circular cut-outs on the bottom of the bracket and may be threaded into the mounting sleeves on the pod. On the front of the bracket there are two longitudinal grooves on each side of the bracket to allow for insertion of the screws. Located near the top portion of the bracket is a mounting boss which is provided for mounting the pivoting handle. The mounting boss includes a nub on the upper portion which limits the rotational movement of the spindle and a notch on the lower portion which limits the rotational movement of the handle as explained hereinafter. There is also a horizontal opening located at the top portion of the bracket for securing the pivoting handle to the bracket. The opening extends entirely through the bracket and is axially aligned with the bracket mounting boss.

The pivoting handle is contoured to a shape and is formed so as to be held in a modified pistol grip manner. The modified pistol grip is similar to holding a pistol. The pivoting handle includes a flange portion, a gripping portion, and grooves. The flange portion is located at the top of the handle, and distributes the load of the pod evenly and effectively. The flange portion also overhangs the gripping portion to provide a place for the thumb and first finger to be positioned underneath and prevent slippage of the handle through a user's hand. Under the overhanging portion of the flange where the thumb is placed, there is an increased radius at an interior part allowing for a better thumb fit.

Attached to the bottom of the flange portion is the gripping portion which is where the user places his/her palm and fingers. The gripping portion includes grooves on one side for placement of the fingers. The grooves facilitate a better grip for the user when transporting the pod. On the opposite side of the grooves, the contour is slightly rounded for comfort of the palm and thumb. Gentle contouring of the pivoting handle, including smooth edges, is desired to relieve the pressure on the user's hand. The back of the pivoting handle includes a mounting boss which engages the bracket mounting boss. Provided on the lower portion of the handle mounting boss, there is a projection which interacts with the notch located on the bottom of the bracket mounting boss. The projection is slightly smaller than the notch on the mounting boss of the bracket and allows for the rotational motion of the handle when the pod is manually carried to and from processing tools in the bay. The optimal amount of rotation is approximately 55 degrees but can be varied by changing the width of the projection and/or notch. The handle also includes a horizontal opening located at the top portion of the handle for securing the handle to the bracket. The opening extends entirely through the handle and is axially aligned with the handle mounting boss.

A spindle is provided in order to secure the handle to the bracket and serve as an axis for the pivoting handle. The spindle includes a tubular portion and a round flanged-head portion. The spindle is inserted through the opening located at the top portion of the handle so that the round flanged-head portion is flush with the front of the pivoting handle and the tubular portion is in proximate contact with the opening of the pivoting handle. The spindle includes a slot which engages the nub on the bracket mounting boss which prevents rotation of the spindle. The spindle is then secured to the bracket by a screw which is inserted through the back of the bracket and screwed into a threaded bore formed partially through a center of the tubular portion and thereafter turned to tighten.

The handle is secured to the bracket by the spindle and attached to the pod via the brackets on each side near the top of the cover. When the pod is being lifted or lowered by a user, the pivoting handle allows the pod to be manually carried without wrist rotation. Since the handles are mounted near the top portion of the pod, the pod remains substantially vertical because the center of gravity of the pod is below the center of rotation of the pivoting handle.

BRIEF DESCRIPTION OF THE DRAWINGS

The invention will now be described with reference to the drawings in which.

DETAILED DESCRIPTION OF THE PREFERRED EMBODIMENTS

The present invention will now be described with reference to FIGS. 3 through 18 which in general relate to a SMIF pod having ergonomic pivoting side handles for manually transporting a pod within a bay of a semiconductor wafer fab. While the preferred embodiment of the invention may operate with SMIF pods, it is understood that the type of pod utilized is not critical to the present invention, and any of various containers in which semi-conductor wafers are housed may operate with the present invention. This includes, but is not limited to, bottom opening pods, front opening pods, cassetteless pods, and open cassettes in which the wafers are seated. Additionally, it is contemplated that work pieces other than semiconductor wafers may be provided within the pods, including reticles, flat paneled displays, and any other substrates which may be transported within pods.

Figure 5:
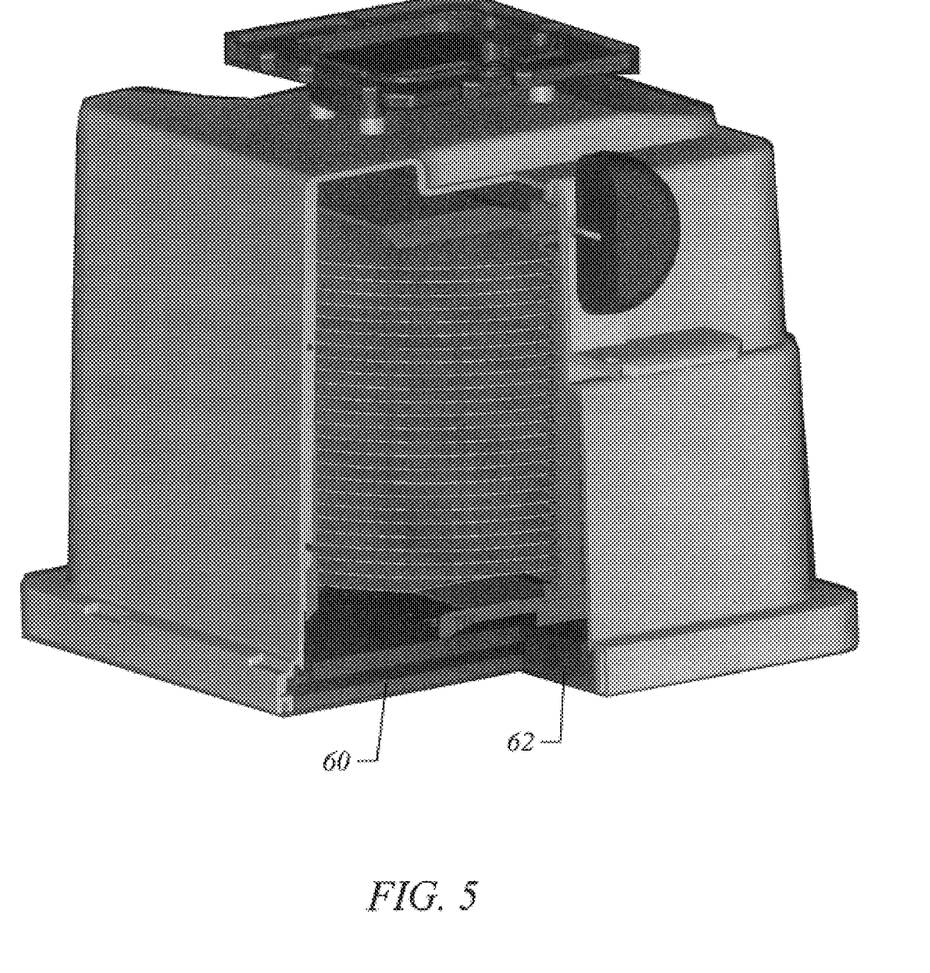
FIG. 5 is an isometric cut-away view of the pod showing a cassette within the pod.

Referring now to FIGS. 3 through 6, there is shown a SMIF pod 50. The SMIF pod 50 includes a cover 52, an automation handle 54, a handle assembly 56, an electronic tag mounting bracket 58, and a pod door 60. The cover 52 has an interior region for holding a semiconductor wafer cassette 62, as shown in FIG. 5. Secured to the bottom of the cover 52 is the pod door 60 (FIG. 5) on which the cassette 62 is supported and located. Also, the cover 52 includes a feature (not shown) which prevents the cassette from dislocating from the pod door. The pod door 60 is designed to mate with a port door on the interface port of the processing equipment enclosures and includes decoupling mechanisms (not shown) which release the pod door 60 from the pod cover 52. The front of the cover 52 includes the electronic tag mounting bracket 58 which stores information identifying a particular wafer lot within the pod 50, and the particular processes to be performed on the wafer lot. It is understood that the electronic tag mounting bracket 58 is not critical to the present invention, and may be omitted in alternate embodiments. On top of the cover 52 is the automation handle 54 for lifting up the pod 50 from above. The automation handle 54 is utilized by a conveyor or a robotic arm when the pod 50 is automatically transferred to or from processing tools.

Figure 6:
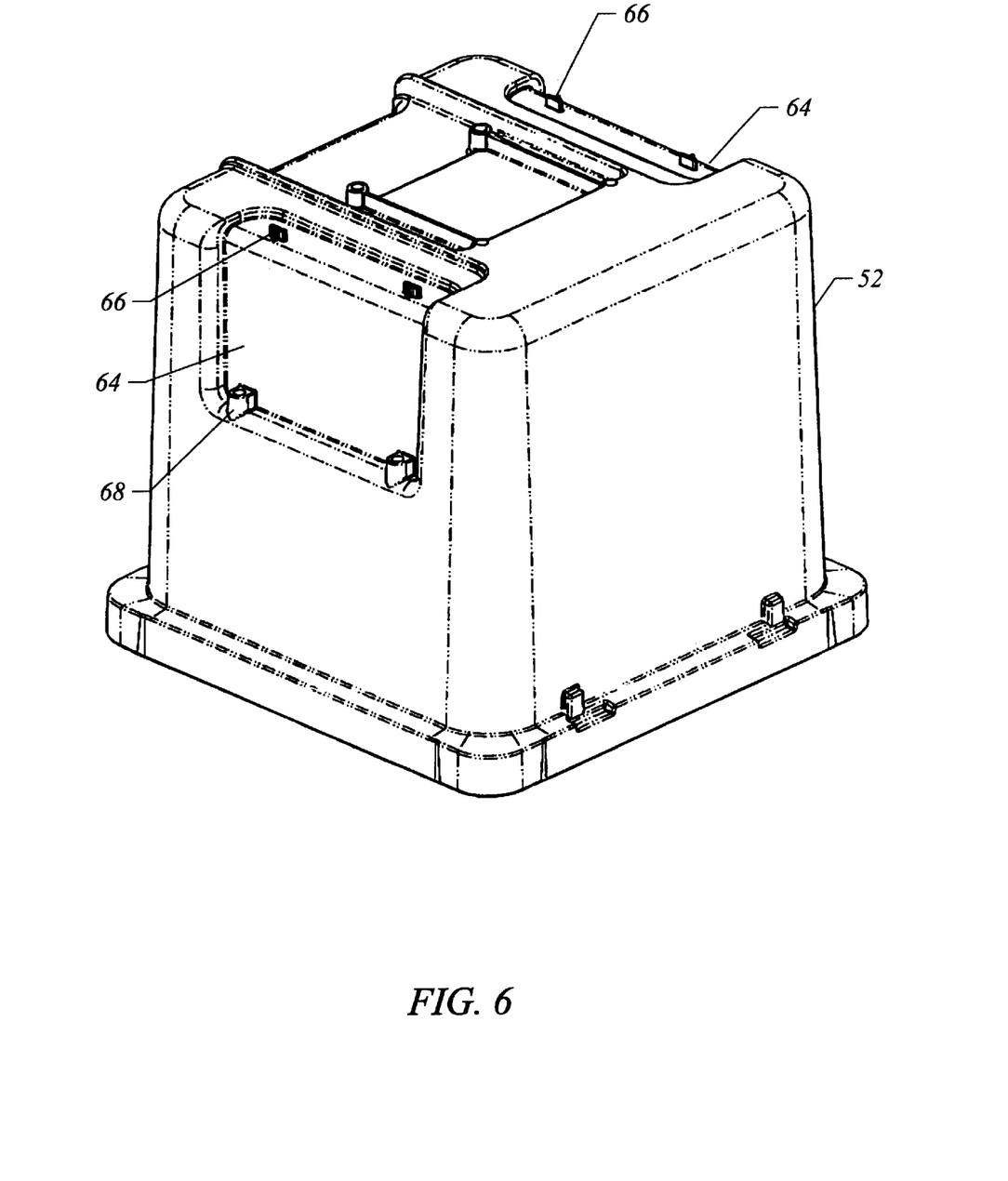
FIG. 6 is an isometric view of the pod without the pivoting side handles attached illustrating an recessed area including T-shaped protrusions and mounting sleeves for attachment of the bracket according to the present invention.
Figure 7:
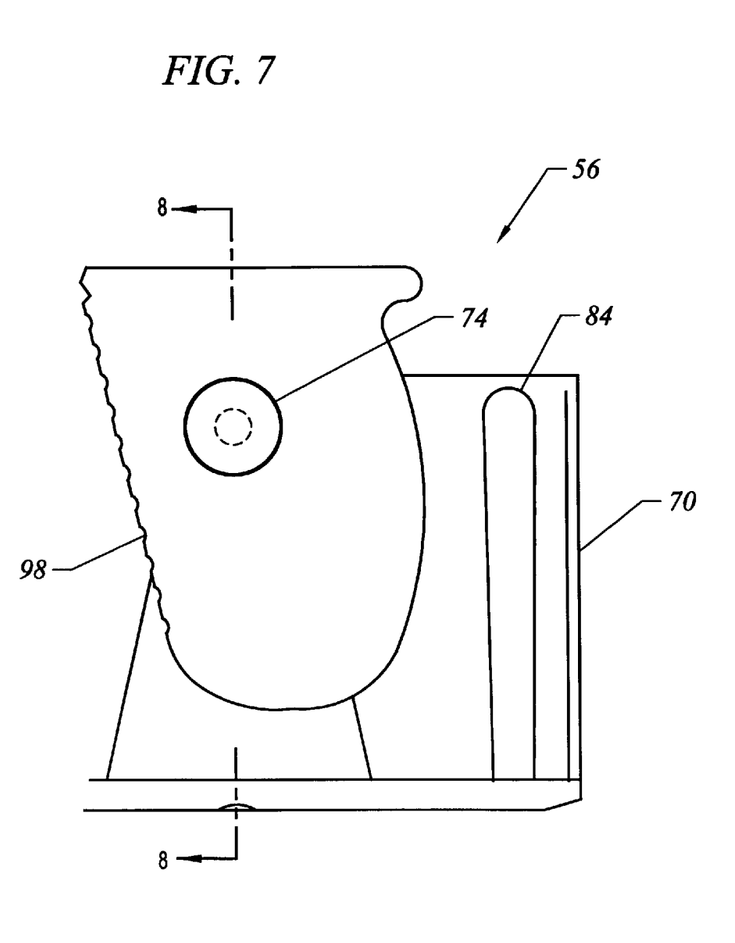
FIG. 7 is a front view of a handle assembly according to the present invention.
Figure 8:
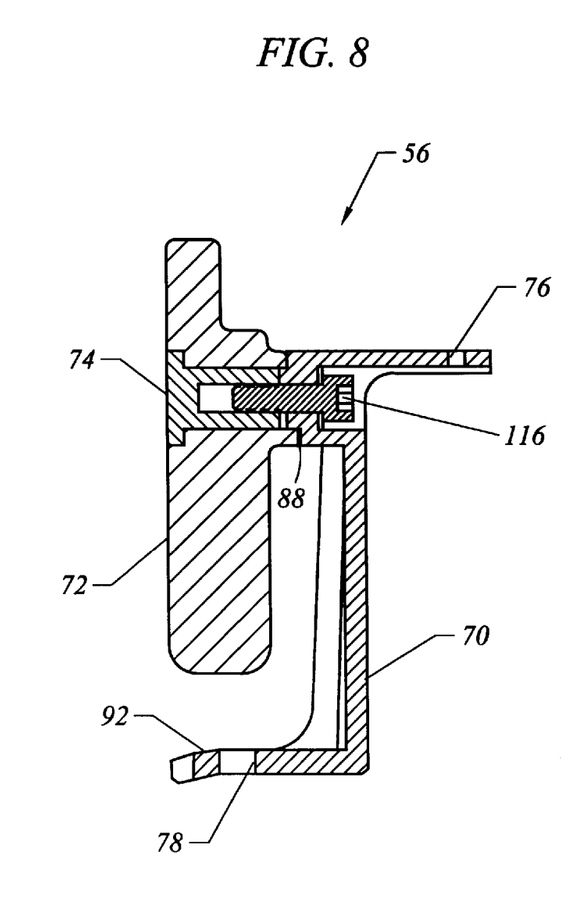
FIG. 8 is a cross-sectional side view of the handle assembly through line 8—8 of FIG. 7 according to the present invention.

Each side of the cover 52 has a square shaped recessed area 64 which extends onto the top of the pod cover 52, as shown in FIG. 6. Included on each corner of the recessed area 64 which extends onto the top of the cover 52 is a T-shaped protrusion 66. Also, there is a mounting sleeve 68 located at each lower corner of the recessed area 64 on the sides of the cover 52. The T-shaped protrusions 66 and mounting sleeves 68 are provided so that the handle assembly 56 can be fully secured and supported on the pod 50, which will be explained in greater detail below.

With reference to FIGS. 7 through 12, the handle assembly 56 will now be described. The handle assembly 56 includes a bracket 70, a pivoting handle 72 and a spindle 74. As explained in the Background of the Invention section, the handle assembly 56 reduces risk of hand and wrist injury to the user and enhances comfort and work productivity because it allows the wrist to remain neutral without wrist rotation, while the pod 50 rotates to a vertical position, as it is transported to and from processing tools. Although the wrist do not rotate in the present invention, the user remains free to rotate his/her arms at the shoulder or elbow region for handling of the pod during transport.

Figure 3:
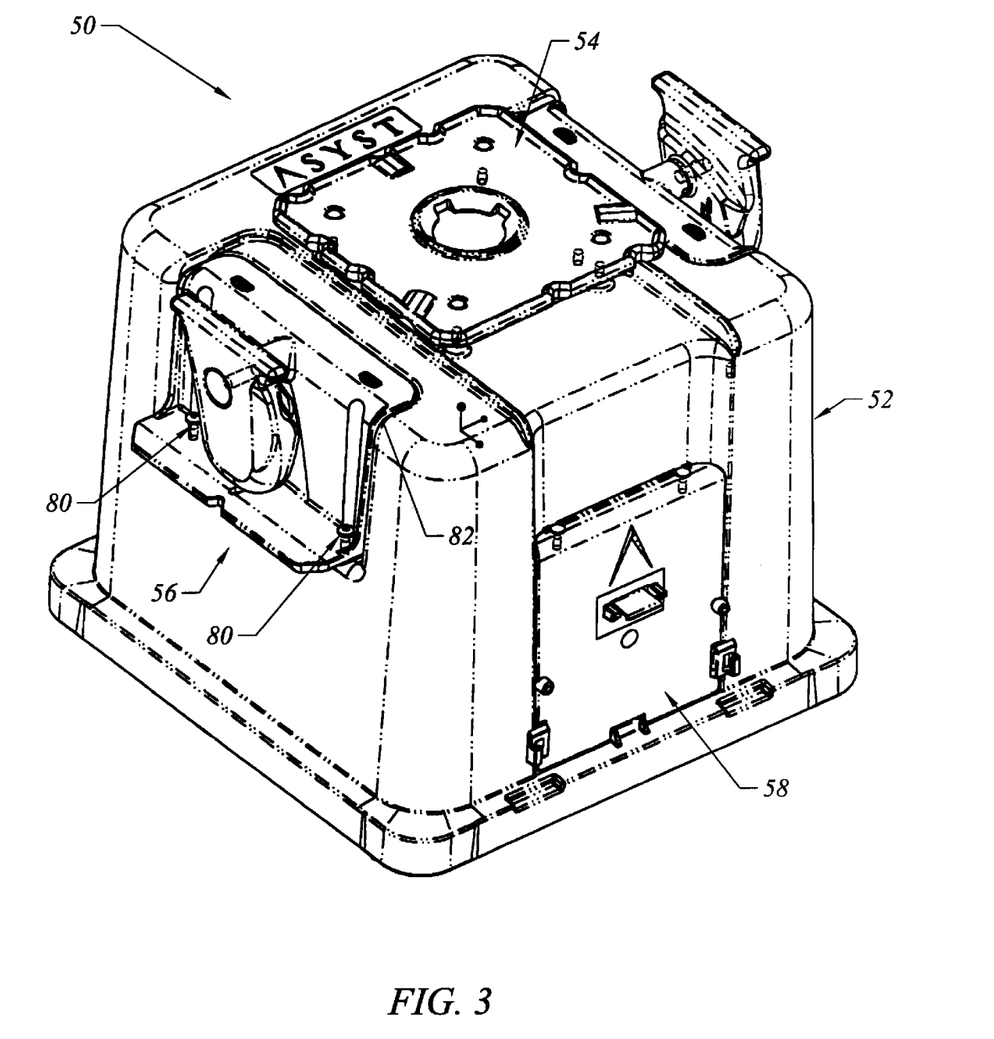
FIG. 3 is an isometric front view of a pod including the pivoting side handles according to the present invention.
Figure 4:
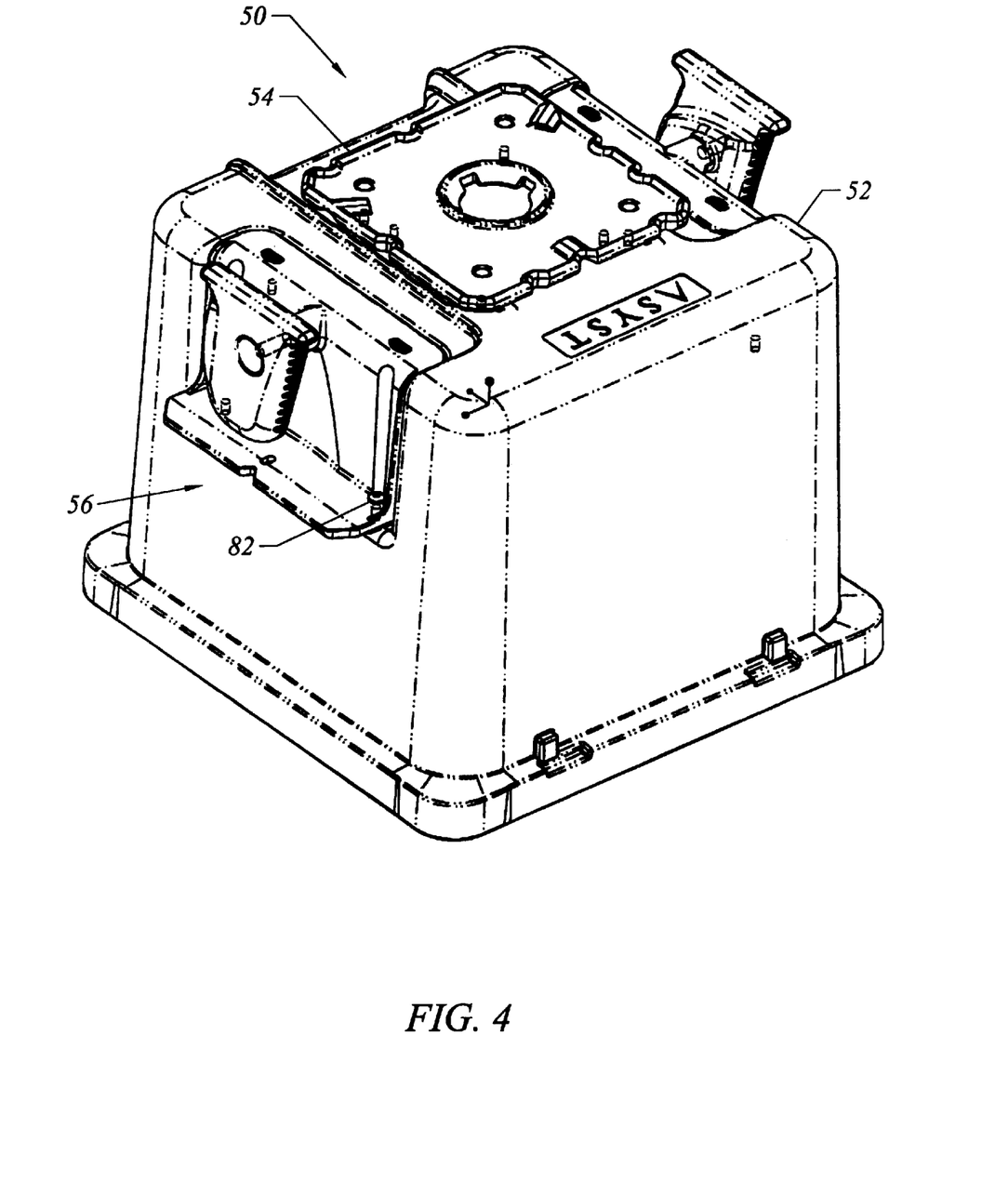
FIG. 4 is an isometric back view of the pod including pivoting side handles according to the present invention.
Figure 9:
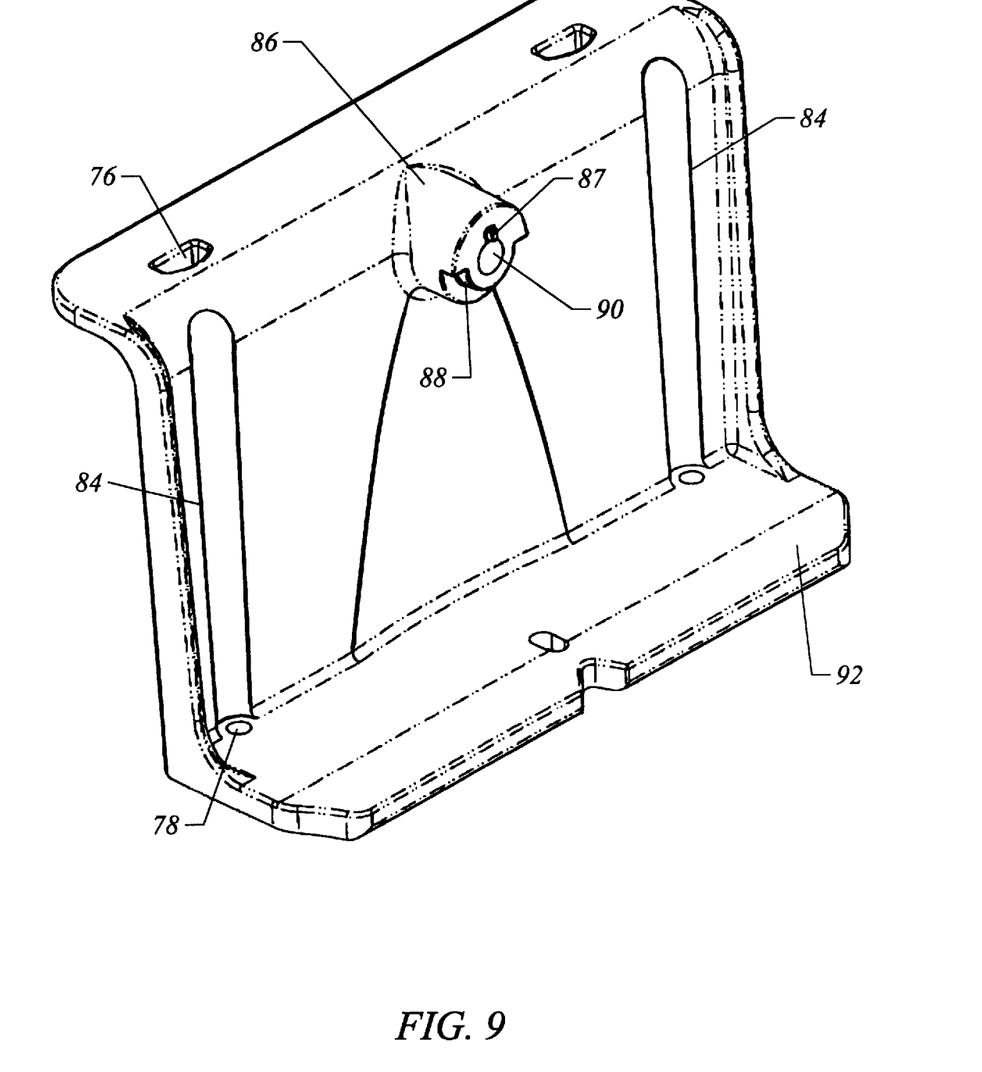
FIG. 9 is an isometric front view of a bracket according to the present invention.

A bracket 70, shown in FIG. 9, is provided for securely supporting the pivoting handle 72 on the pod 50. The bracket 70 is a Z-shaped member (See FIG. 8) and includes two D-shaped cut-outs 76 at the top of the bracket and two circular cut-outs 78 at the bottom of the bracket 70. The bracket 70 may be securely attached to the side of the pod 50 by placing the D-shaped cut-outs 76 over the T-shaped protrusions 66 located on the recessed area 64 on the top of the pod cover 52, and also by aligning the circular cut-outs 78 with the mounting sleeves 68 located on the bottom of the recessed area 64 on the side of the pod cover. D-shaped cut-outs are preferred in plastic part design. Curved areas, as compared to sharp edges, facilitate simple design manufacturing. A plurality of screws 80 (See FIG. 3) fit through the circular cut-outs 78 on the bottom of the bracket 70 and may be threaded into the mounting sleeves 68 on the pod cover 52. A small gap 82 between the back of the bracket 70 and the pod cover 52, as shown in FIG. 3, is provided to allow for drainage of water when the pod 50 is being washed by a spray application or immersion. On the front of the bracket 70 there are two longitudinal grooves 84 on each side of the bracket 70 to allow for insertion of the screws 80. The grooves 84 are necessary because the thickness of the bracket provides limited space for insertion of the screws 80. As would be appreciated by those of skill in the art, various other fastener systems may be used to removably or permanently affix the bracket 70 to the pod 50.

Located on an upper portion of the bracket 70 is a mounting boss 86 which is provided for mounting the pivoting handle 72 as shown in FIG. 9. The mounting boss 86 includes a nub 87 on the upper portion which limits the rotational movement of the spindle 74 and a notch 88 on the lower portion which limits the rotational movement of the handle 72 as explained hereinafter. There is also a horizontal opening 90 located at the upper portion of the bracket 70 for securing the pivoting handle 72 to the bracket 70. The opening 90 extends entirely through the bracket 70 and is axially aligned with the bracket mounting boss 86. It is understood that the bottom of the Z-shaped bracket 70 has a flange 92 which also provides a means for transporting the pod 50. The flange 92 may be used to lift the pod 50 with the forefingers of a user or for automated handling of the pod. This may be preferred in situations where the user is not in a suitable position to grip the pivoting handle 72. The bracket 70 is preferably formed from a stable, strong, rigid and light weight material. A preferred material for the bracket is a long fiber reinforced fire retardant nylon, such as a "Verton" plastic, which is manufactured by LNP, 475 Creamery Way, Exton, Pa., 19341. The bracket may also be formed from metal, polymer and other materials. In the preferred embodiment, the bracket may be formed by injection molding, as well as casting or machining.

Figure 10:
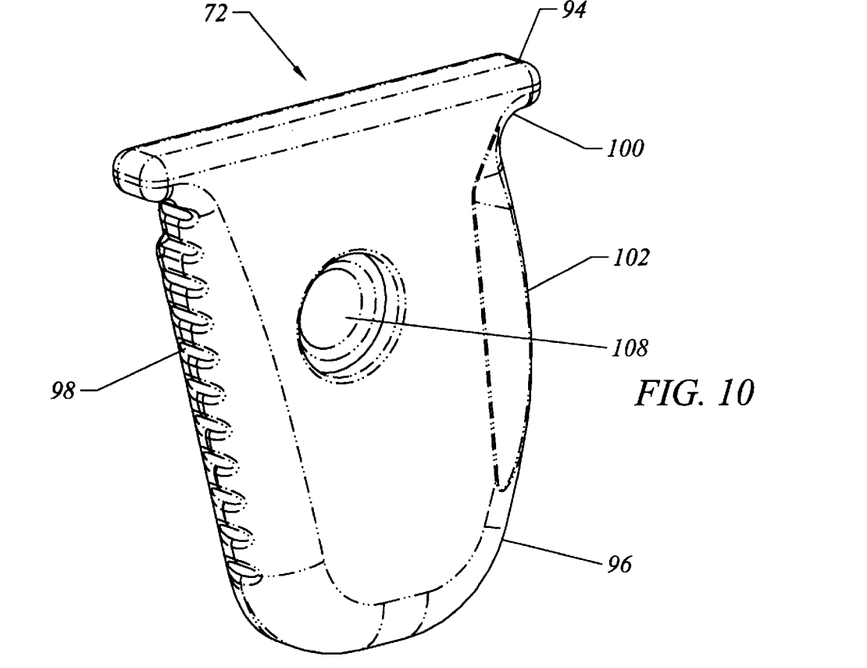
FIG. 10 is an isometric front view of a pivoting side handle according to the present invention.
Figure 11:
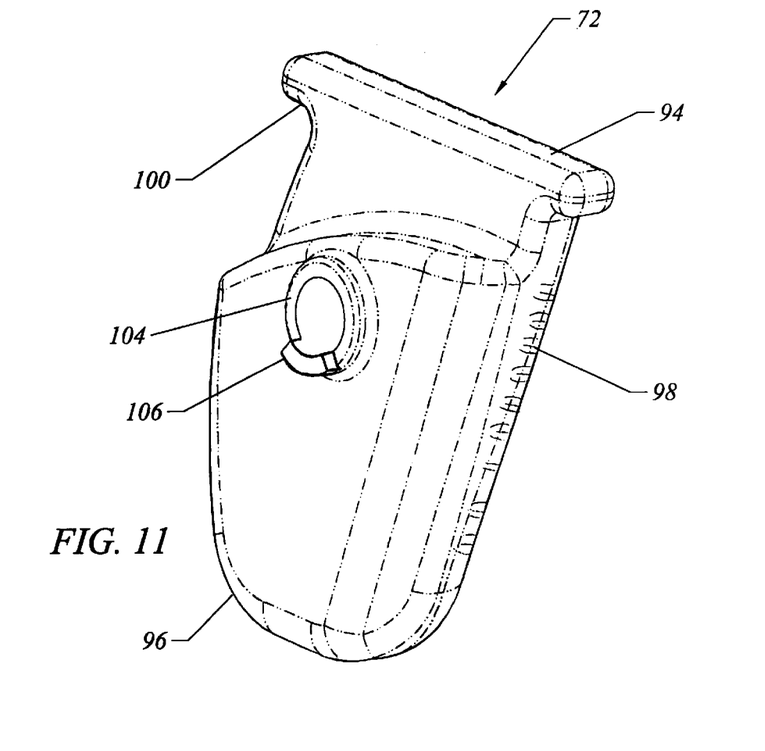
FIG. 11 is an isometric back view of a pivoting side handle according to the present invention.

FIGS. 10 and 11 depict the pivoting handle 72 according to the present invention. The pivoting handle 72 is contoured to a shape and is formed so as to be held in a modified pistol grip manner. The modified pistol grip is similar to holding a pistol. The pivoting handle 72 includes a flange portion 94, a gripping portion 96, and grooves 98. The flange portion 94 is located at the top of the handle 72, and distributes the load of the pod 50 evenly and effectively. The load of the pod is distributed over a larger area (i.e. the length of the flange) thereby providing a lower load per square inch. The flange portion 94 overhangs the gripping portion 96 to provide a place for the thumb and first finger to be positioned underneath. The flange portion 94 also prevents the handle 72 from sliding through a user's hand under circumstances where a user may relax his/her grip of the handle. Under the overhanging portion of the flange portion 94 where the thumb is placed, there is an increased radius at an interior part 100 allowing for a better thumb fit.

Attached to the bottom of the flange portion 94, is the gripping portion 96 which is where the user places his/her palm and fingers. The gripping portion 96 includes grooves 98 on one side for placement of the fingers. The grooves 98 facilitate a better grip for the user when transporting the pod 50. It is also understood that ridges may be added to the gripping portion to enhance the grip of the user. On the opposite side of the grooves 98, the contour 102 is slightly rounded for comfort of the palm and thumb. Gentle contouring of the pivoting handle 72, including smooth edges, is desired to relieve the pressure on the Thenar muscle group of a user's hand which is caused by sharp edges.

The back of the pivoting handle 72 includes a mounting boss 104 which engages the bracket mounting boss 86. Provided on the lower portion of the handle mounting boss 104, there is a projection 106 which interacts with the notch 88 located on the bottom of the bracket mounting boss 86. The notch portion on the bracket defines an arc having a length of approximately 180°. The projection on the handle defines an arc length of approximately 125°. Thus, the handle is capable of rotating approximately 55° with respect to the bracket and pod without the projection engaging the notch portion. The projection and notch together limit rotation of the handle with respect to the bracket and pod as a result of a surface of the projection engaging a surface of the notch. Upon such engagement, any further rotation of the handle in that direction will cause a corresponding rotation of the bracket and pod. The amount of rotation can be varied more or less by changing the width of the projection and/or the notch.

The pivoting handle 72 also includes a horizontal opening 108 located at the upper portion of the handle 72 for securing the handle 72 to the bracket 70. The opening 108 extends entirely through the handle 72 and is axially aligned with the handle mounting boss 104, as shown in FIG. 11. A spindle 110 (FIG. 12) is inserted through the opening 108 and serves as an axis for the pivoting handle 72, as explained hereinafter.

In a preferred embodiment, the pivoting handle 72 has a length of approximately 3.5 in. at its longest point and a width of approximately 2.5 in at its widest point. The thickness of the handle 72 is approximately 0.85 in. (The handle including the mounting boss has a thickness of 1.0 in.) and the handle 72 weighs approximately ¼ to ⅓ lb. The thickness of the handle 72 must allow an operator's thumb to fit between the handle and pod, and still meet the industry width standards for a wafer container with automation flanges, such as for a 200 mm pod or 300 mm pod. It is understood that the dimensions of the pivoting handle may be varied dependent upon the desired pod or container that the handle is attached to during transport within a bay of a semiconductor fab.

In the preferred embodiment, the material used for the handle 72 should be relatively clean and not produce out gassing. Also the material should be formed with a smooth bearing surface within opening 108 which is necessary for providing smooth rotational motion of the handle when the pod is being lifted, lowered, and transported. The preferred material of the handle 72 is plastic, such as a polypropylene, nylon or an aliphatic polyketone, but metal and other materials may be used. With regard to metal, it is the least preferred material because it is typically heavy, expensive and difficult to mold into a particular shape. The pivoting handle of the present invention may be hollow in an effort to reduce the weight of the pod. The handle may be formed by injection molding wherein the gas is injected into the center of the handle. The gas remains inside the handle and pushes the material which is a liquid out and then solidifies to form a hollow handle. It is understood that the pivoting handle may be formed by other processes besides injection molding, such as casting, laser milling or machining. Also, the pivoting handle may be made so that the handle is solid.

Figure 12:
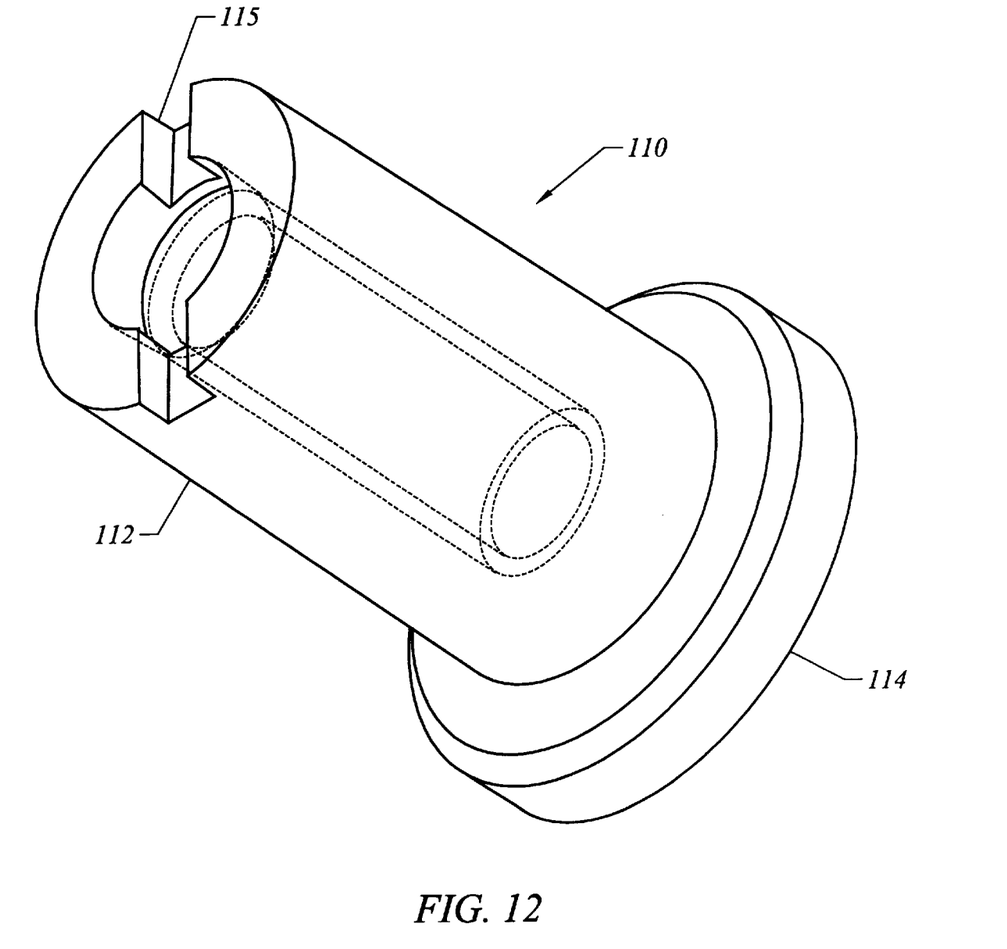
FIG. 12 is an isometric view of the spindle according to the present invention.

With regard to FIG. 12, the spindle 110 is provided in order to secure the pivoting handle 72 to the bracket 70 and serve as an axis and support for the pivoting handle 72. The spindle 110 includes a tubular portion 112 and a round flanged-head portion 114. The spindle 110 is inserted through the opening 108 located at the top portion of the handle 72 so that the round flanged-head portion 114 is flush with the front of the pivoting handle 72 and the tubular portion 112 is in proximate contact with the opening 108 of the pivoting handle 72. At the other end of the spindle opposite the round flanged-head portion 114, there is a slot 115 for mounting to the nub 87 on the top portion of the bracket mounting boss 86. The slot 115 provides an anti-rotation feature which prevents the spindle 114 from rotating during transportation of the pod. The spindle 110 is then secured to the bracket 70 by a securing member comprising a screw 116 (See FIG. 8) which is inserted through the back of the bracket 70 and screwed into a threaded bore formed partially through the center of the tubular portion and thereafter turned to tighten. The slot 115 also allows the screw 116 to be tightened without rotation of the spindle 114. Once completely secured, the pivoting handle 72 is permitted to rotate when the pod 50 is being transported.

In the preferred embodiment, the spindle 110 is preferably made of a hard, light and rigid material such as an anodized aluminum 7075-T6. Moreover, the spindle 110 must also be formed with a smooth bearing surface in order to allow the pivoting handle 72 to rotate freely while producing minimal friction between the pivoting handle and spindle. It is understood that other materials may be used for the spindle, such as other metal alloys, plastic, magnesium and other materials. It also is understood that in the preferred embodiment the pivoting handle may be attached to the bracket and/or pod with other types of known fastening methods. It is further contemplated that the bracket may be omitted and the handle rotatably affixed directly to the pod.

The handle 72 is secured to the bracket 70 by the spindle 110 and attached to the pod 50 via the brackets 70 on each side near the top of the cover 52. When the pod 50 is being lifted or lowered by a user, the pivoting handles 72 allow the pod to be manually carried. Since the handles 72 are mounted near the top portion of the pod cover 52, the pod 50 remains substantially vertical because the center of gravity of the pod 50 is below the center of rotation of the pivoting handle 72.

Figure 13:
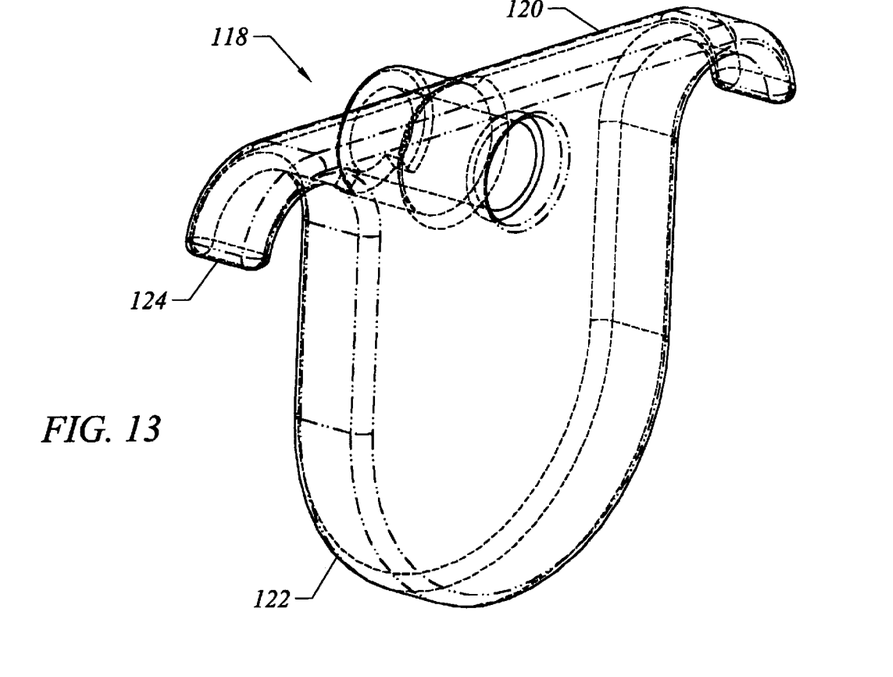
FIG. 13 is an isometric front view of a T-shaped pivoting side handle according to the present invention.
Figure 14:
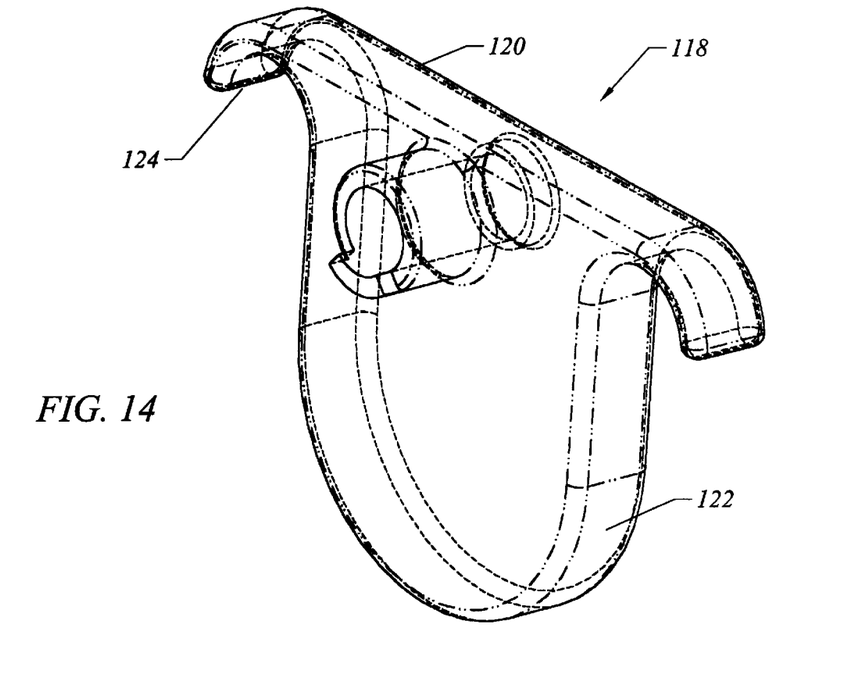
FIG. 14 is an isometric back view of the T-shaped pivoting side handle according to the present invention.
Figure 15:
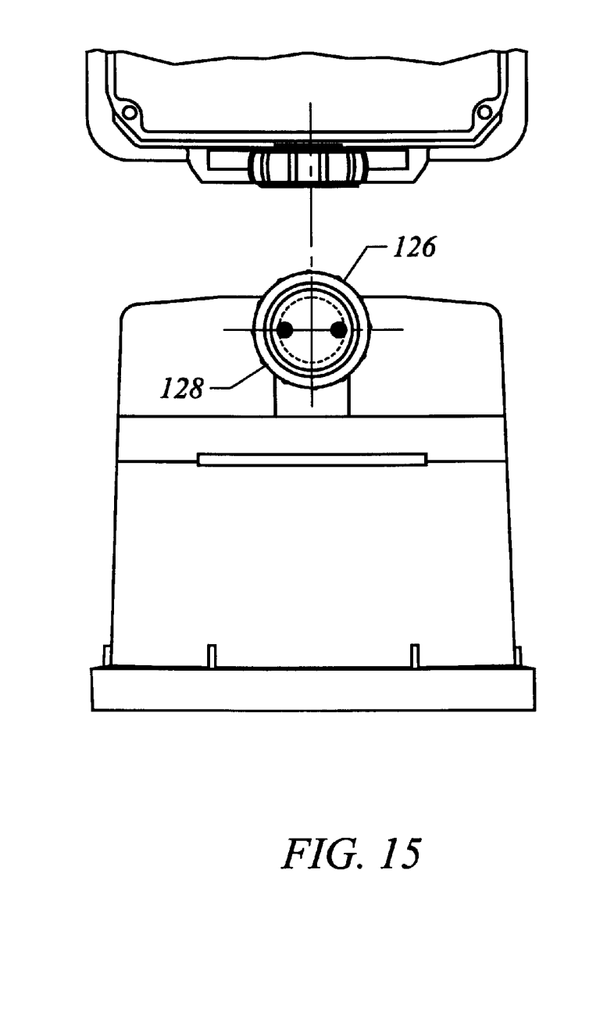
FIG. 15 is a front view of a round pivoting side handle according to the present invention.
Figure 16:
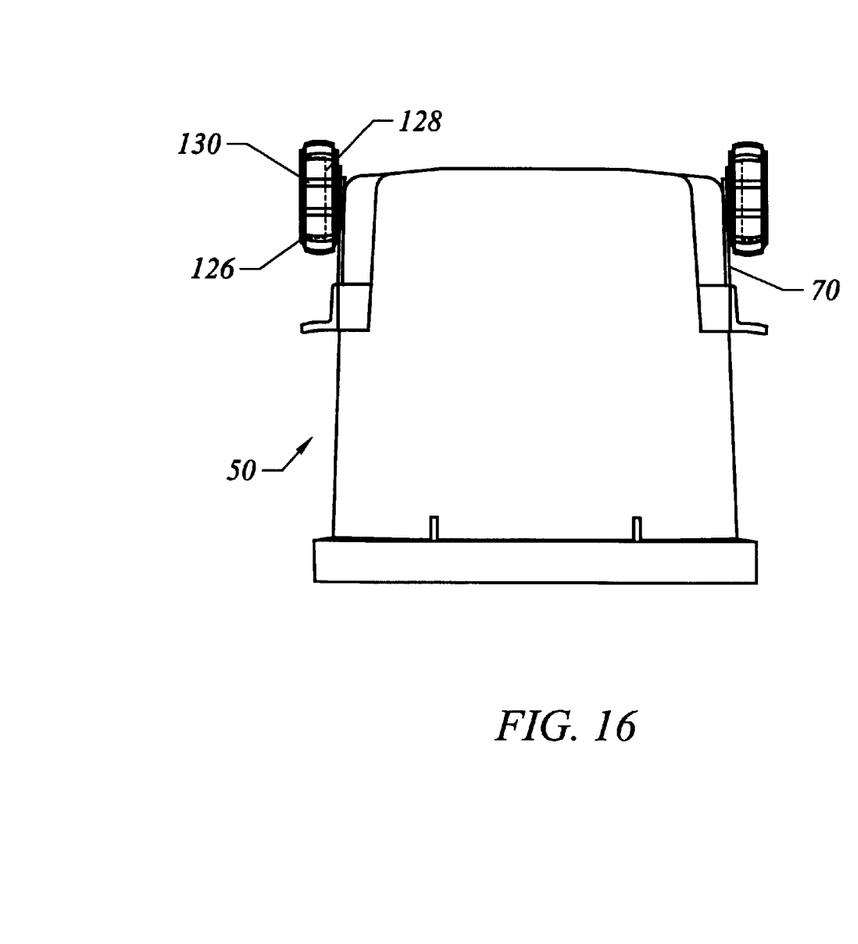
FIG. 16 is a side view of the round pivoting side handle according to the present invention.
Figure 17:
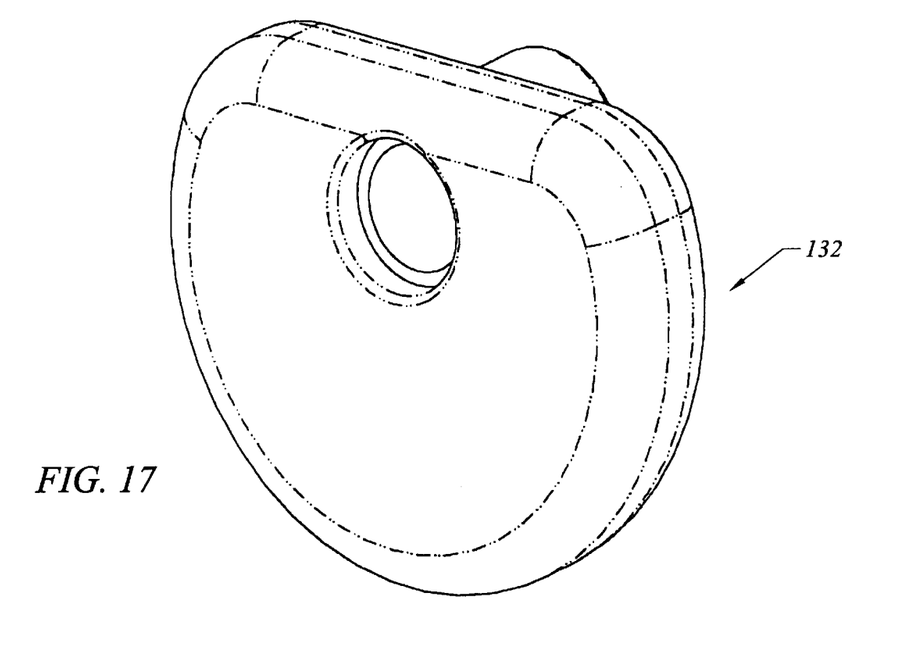
FIG. 17 is an isometric front view of a C-shaped pivoting side handle according to the present invention.
Figure 18:
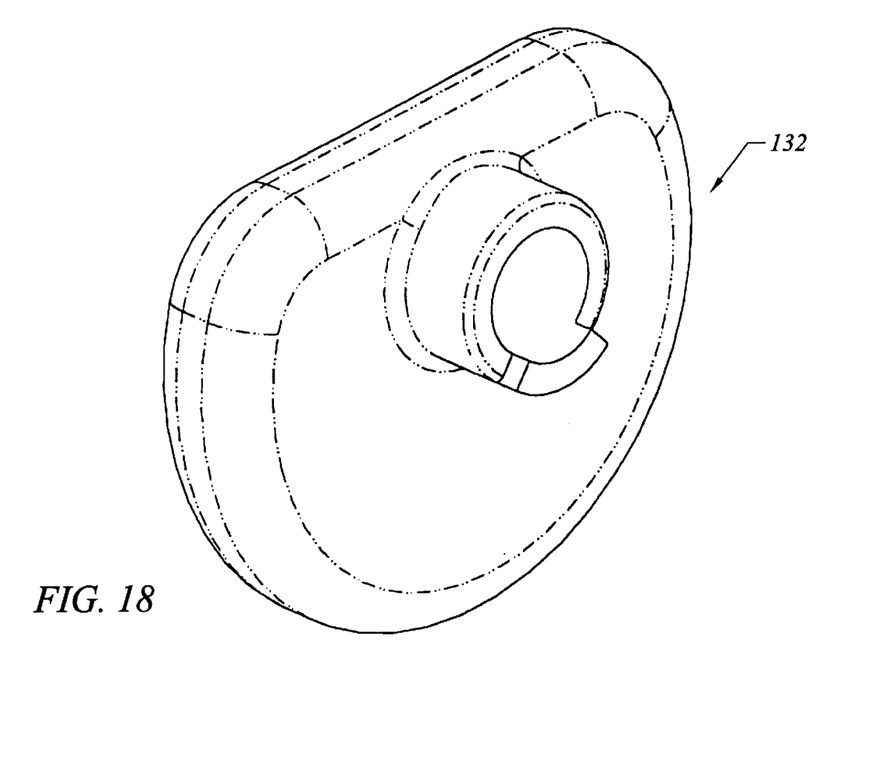
FIG. 18 is an isometric back view of the C-shaped pivoting side handle according to the present invention.

With regard to FIGS. 13 through 18, alternate embodiments of the pivoting handle are shown. Referring to FIGS. 13 and 14, a T-shaped pivoting handle 118 is shown. The T-shaped pivoting handle 118 has top portion 120 and a gripping portion 122, similar to the pivoting handle 72 previously described. The top portion 120 includes a flange with ends 124 which curl around to form a partial circle. Attached to the top portion 120 is a gripping portion 122 which is shaped like an elongated dome. The T-shaped handle 118 comprises the same mounting and pivoting configuration as the pivoting handle 72 described above. Referring to FIGS. 15 and 16, a round pivoting handle 126 is shown. Included on the outer portion of the round handle 126 is a locking mechanism 128 which is a tire-like outer ring having rims 130. When accurately locating the pod 50 on a processing tool within a bay of semiconductor wafer fab, the tire-like rims 130 may be lightly squeezed in order to lock the handle 126 and thereby gain rotational control of the pod 50. The round pivoting handle 126 does not include the same mounting and pivoting configuration as in the other embodiments of the present invention. Referring to FIGS. 17 and 18, a C-shaped pivoting handle 132 is depicted. The C-shaped handle 132 comprises the same mounting and pivoting configuration as the pivoting handle 72 described above. It is understood that the invention is not limited to the geometries shown in the figures. Furthermore, it is advantageous to have various configurations of the handle in order to accommodate users of different stature, sizes, and preferences.

Although the invention has been described in detail herein, it should be understood that the invention is not limited to the embodiment herein disclosed. Various changes, substitutions and modifications may be made thereto by those skilled in the art without departing from the spirit or scope of the invention as described and defined by the appended claims.

What is claimed is:

1. An ergonomic pivoting handle assembly for attachment to a standard mechanical interface pod, comprising:
   a handle for manually transporting the pod, said handle allowing the pod to pivot with respect to said handle during said transport of the pod;
   a bracket for securely supporting said pivoting handle on the pod;
   a spindle for supporting said pivoting handle; and
   a securing member located on said bracket for attaching said pivoting handle and said spindle to said bracket said securing member comprising a mounting boss having a nub on an upper portion and a notch on a lower portion; and
   a second mounting boss located on a back of said pivoting handle for engaging said mounting boss of said bracket, said second mounting boss including a projection on a lower portion which mates with said notch on said mounting boss of said bracket.

2. The ergonomic pivoting handle as recited in claim 1, further comprising a slot on an end of said spindle for mating with said nub on said mounting boss of said bracket.

3. The ergonomic pivoting handle as recited in claim 1, wherein said notch on said mounting boss of said bracket defines an arc having a length of approximately 180° and said projection on said second mounting boss of said pivoting handle defines an arc length of approximately 125°, said pivoting handle being capable of rotating approximately 55° with respect to said bracket.

* * * * *